(12) United States Patent
Nishimura et al.

(10) Patent No.: US 9,150,969 B2
(45) Date of Patent: Oct. 6, 2015

(54) METHOD OF ETCHING METAL LAYER

(71) Applicant: TOKYO ELECTRON LIMITED, Tokyo (JP)

(72) Inventors: Eiichi Nishimura, Miyagi (JP); Fumiko Yamashita, Miyagi (JP); Koyumi Sasa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/196,376

(22) Filed: Mar. 4, 2014

(65) Prior Publication Data

US 2014/0251945 A1 Sep. 11, 2014

Related U.S. Application Data

(60) Provisional application No. 61/776,917, filed on Mar. 12, 2013.

(30) Foreign Application Priority Data

Mar. 5, 2013 (JP) .................. 2013-043100

(51) Int. Cl.
*H01L 21/302* (2006.01)
*C23F 4/00* (2006.01)
*H01L 21/02* (2006.01)
*H01L 21/3213* (2006.01)
*H05K 3/02* (2006.01)

(52) U.S. Cl.
CPC ............ *C23F 4/00* (2013.01); *H01L 21/02071* (2013.01); *H01L 21/32136* (2013.01); *H05K 3/027* (2013.01); *H05K 2203/087* (2013.01); *H05K 2203/092* (2013.01); *H05K 2203/095* (2013.01); *H05K 2203/1388* (2013.01); *H05K 2203/1484* (2013.01); *H05K 2203/1492* (2013.01); *H05K 2203/1509* (2013.01)

(58) Field of Classification Search
CPC .............................. C23F 1/12; H01L 21/02071
USPC .................. 438/745; 430/318, 311, 299, 310; 216/83
See application file for complete search history.

(56) References Cited

U.S. PATENT DOCUMENTS 6,080,529 A * 6/2000 Ye et al. ................. 430/318
6,143,476 A * 11/2000 Ye et al. ................. 430/318

OTHER PUBLICATIONS

Lee et al. Journal of the Korean Physical Society, vol. 40, No. 1, Han (2002) pp. 152-155.*
Fangyu Wu et al., "Low-Temperature Etching of Cu by Hydrogen-Based Plasma", ACS Applied Materials & Interfaces, 2010, vol. 2, No. 8, p. 2175-2179.

* cited by examiner

*Primary Examiner* — Duy Deo
*Assistant Examiner* — Maki Angadi
(74) *Attorney, Agent, or Firm* — Rothwell, Figg, Ernst & Manbeck, P.C.

(57) ABSTRACT

In a method of etching a metal layer of an object to be processed, the metal layer is etched by ion sputtering etching while forming a protective film containing carbon on a surface of a mask of the object. The object is exposed to an oxygen plasma after etching the metal layer. The object is exposed to hexafluoroacetylacetone after exposing the object to the oxygen plasma.

3 Claims, 14 Drawing Sheets

| STEP | NUMBER OF CYCLE | PRESSURE (mTorr/Pa) | HF (W) | LF (W) | H₂ (sccm) | Ar (sccm) | CH₄ (sccm) | O₂ (sccm) | CF₄ (sccm) | SiCl₄ (sccm) | hfacH (sccm) | N₂ (sccm) | TEMPERATURE (°C) | PROCESSING TIME (sec) |
|---|---|---|---|---|---|---|---|---|---|---|---|---|---|---|
| S1b | 1 | 50/6.666 | 300 | 50 | | | | | | | | | 80 | 20 |
| S1c | 1 | 10/1.333 | 200 | 500 | | | | 200 | 100 | 3 | | | 80 | 15 |
| S2a | 1 | 40/5.3333 | 650 | 0 | | 200 | | | 200 | | | | 80 | 25 |
| S2b | 1 | 100/13.33 | 600 | 0 | | | | 600 | | | | | 80 | 30 |
| S3a | 6 | 10/1.333 | 500 | 300 | 400 | 100 | | | | | | | 80 | 5 |
| S3b | | 10/1.333 | 500 | 300 | 400 | | 100 | | | | | | 80 | 15 |
| S3d | 1 | 10/1.333 | 500 | 300 | 400 | 100 | | 600 | | | | | 80 | 10 |
| S4 | 1 | 100/13.33 | 600 | 0 | | | | | | | | | 80 | 180 |
| S5 | 1 | 100/13330 | | | | | | | | | 50 | 50 | 250 | 180 |

METHOD OF ETCHING METAL LAYER

CROSS-REFERENCES TO RELATED APPLICATIONS

The present invention claims priority of Japanese Patent Application No. 2013-043100 filed on Mar. 5, 2013 and U.S. Provisional Application No. 61/776,917 filed on Mar. 12, 2013, the entire contents of which are incorporated herein by reference.

FIELD OF THE INVENTION

The present invention relates to a method for etching a metal layer.

BACKGROUND OF THE INVENTION

When semiconductor devices are manufactured, a process for forming a wiring such as an interconnection line or a contact is carried out. As for this process, a so-called damascene process has been used. In the damascene process, a process for forming a groove or a hole in an interlayer insulating film by etching and burying a metal material in the formed groove or hole is carried out. However, with a recent trend toward miniaturization of a wiring, the damascene process has various problems such as the difficulty of burying a metal material in a fine hole or groove.

In order to deal with the problems of the damascene process, there has been proposed a process for forming a fine copper wiring by forming a copper layer and then etching the copper layer is suggested. This process is disclosed in a document (Fangyu Wu et al., "Low-Temperature Etching of Cu by Hydrogen-Based Plasma", ACS APPLIED MATERIALS & INTERFACES, 2010, Vol. 2, No. 8, p. 2175-2179). In the process disclosed in the above-cited document, the copper layer is etched by exposing the copper layer to a plasma of a processing gas containing hydrogen gas and argon gas.

The process disclosed in the above-cited document is disadvantageous in that the verticality of a side surface of the copper wiring cannot be ensured in the etching using the plasma of the processing gas containing the hydrogen gas and the argon gas. This problem occurs because an angled portion of a mask may be etched during the etching of the copper layer. In order to solve this problem, a method for etching a copper layer while forming a protective film containing carbon on the mask may be considered.

As described above, the protective film contains carbon and is generally removed by a process using an oxygen plasma. However, the present inventors have found that the protective film is not sufficiently removed in the process using an oxygen plasma.

SUMMARY OF THE INVENTION

In view of the above, the present invention provides a method capable of sufficiently removing a protective film formed during etching of a metal layer.

In accordance an aspect, there is provided a method of etching a metal layer, including the steps of: (a) etching a metal layer of an object to be processed by ion sputtering etching while forming a protective film containing carbon on a surface of a mask of the object; (b) exposing the object to an oxygen plasma after etching the metal layer; and (c) exposing the object to hexafluoroacetylacetone after exposing the object to the oxygen plasma. In one embodiment, the metal layer may be made of copper. Here, hexafluoroacetylacetone is 1,1,1,5,5,5-hexafluoroacetylacetone (hereinafter, referred to as "hfacH").

The protective film formed in the step (a) contains, in addition to carbon, a metal generated by etching a metal layer. Carbon in the protective film is removed by exposing the protective film to the oxygen plasma in the step (b). However, the metal contained in the protective film still remains in an oxidized state. In the above-described method, hexafluoroacetylacetonate ligand (hereinafter, referred to as "hfac") generated from hfacH reacts with the metal, thereby generating a complex. Further, hfac is removed as the complex. Therefore, in accordance with this method, it is possible to remove the protective film formed during etching of the metal layer. "hfac" is obtained when hfacH becomes a monovalent anion by separation of H from hfacH.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, various embodiments will be described in detail with reference to the accompanying drawings. Further, like reference numerals will be used for like or corresponding parts throughout the drawings.

Figure 1:
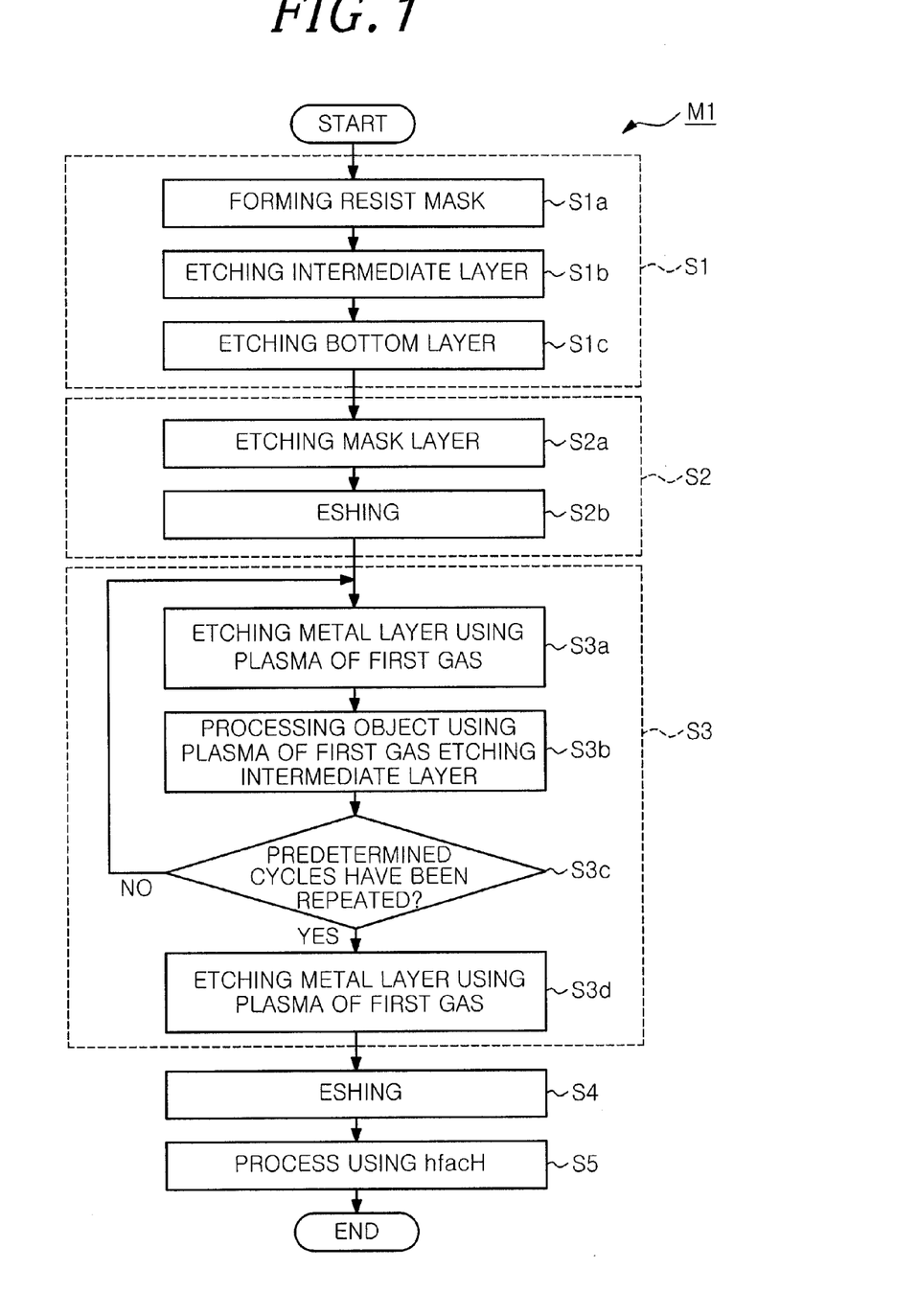
FIG. 1 is a flowchart showing a method M1 of etching a metal layer in accordance with an embodiment.

FIG. 1 is a flowchart showing a method for etching a metal layer in accordance with an embodiment of the present invention. A method M1 shown in FIG. 1 includes a step S3 for etching a metal layer of an object to be processed by ion sputtering etching while forming a protective film containing carbon on a surface of a mask of the object to be processed, a step S4 (ashing step) for exposing the object to an oxygen plasma after the step S3, and a step S5 for exposing the object to hexafluoroacetylacetone. Here, hexafluoroacetylacetone is 1,1,1,5,5,5-hexafluoroacetylacetone which will be referred to as "hfacH" in the following. Further, in the following description, the object to be processed will be referred to as "wafer W", and a metal layer is a copper layer. The metal layer is not limited to the copper layer, i.e., a layer made of copper (Cu), and may be a layer made of another metal.

Figure 2:
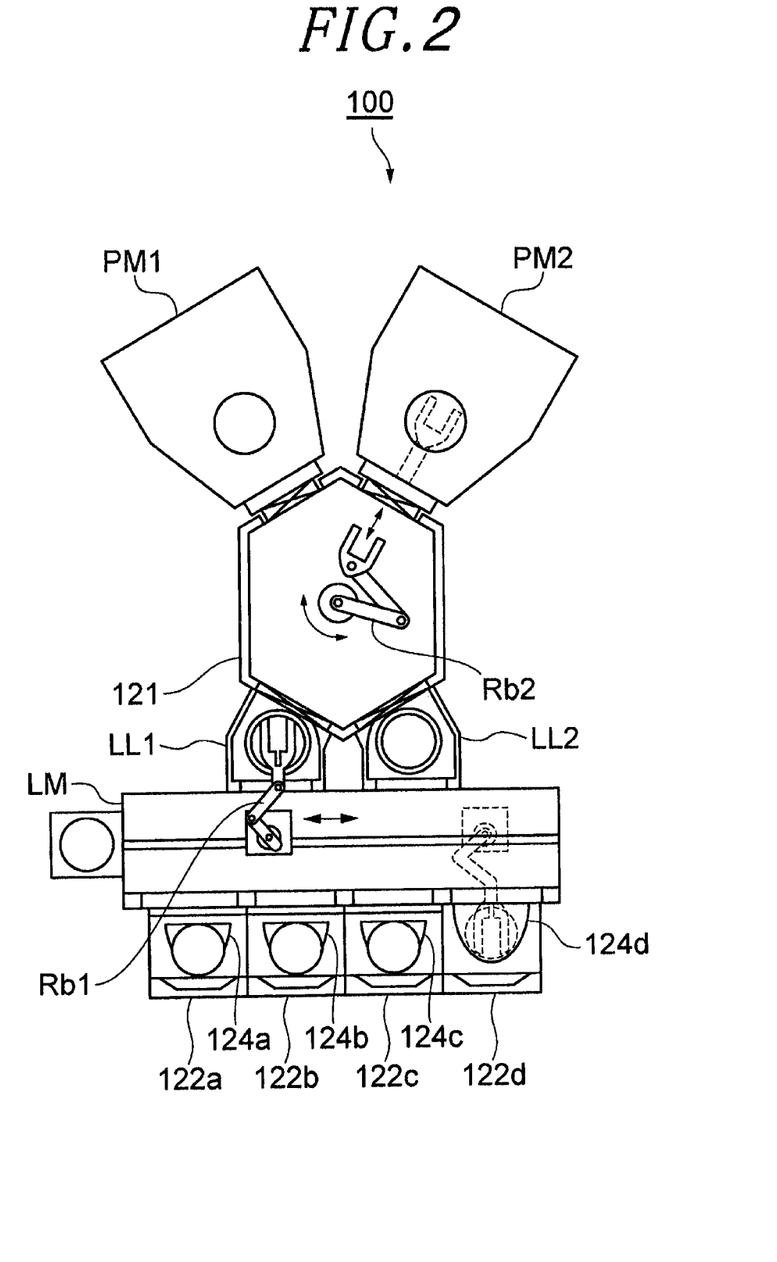
FIG. 2 schematically shows a processing system of the embodiment.

Hereinafter, a processing system that can be used to implement the method M1 shown in FIG. 1 will be described. FIG. 2 schematically shows a processing system in accordance with an embodiment of the present invention. The processing system 100 shown in FIG. 2 includes mounting tables 122a to 122d, accommodating containers 124a to 124d, a loader module LM, load-lock chambers LL1 and LL2, process modules PM1 to PM3, and a transfer chamber 121.

The mounting tables 122a to 122d are arranged along one long side of the loader module LM. The accommodating containers 124a to 124d are mounted on the mounting tables 122a to 122d, respectively. Wafers W are accommodated in the accommodating containers 124a to 124d.

A transfer robot Rb1 is provided inside the loader module LM. The transfer robot Rb1 takes out a wafer W accommodated in one of the accommodating containers 124a to 124d and transfers the wafer W to the load-lock chamber LL1 or LL2.

The load-lock chambers LL1 and LL2 are arranged along the other long side of the loader module LM and act as preliminary decompression chambers. The load-lock chambers LL1 and LL2 are connected to the transfer chamber 121 through respective gate valves.

The transfer chamber 121 is a chamber whose inner pressure can be reduced, and another transfer robot Rb2 is provided inside the transfer chamber 121. The process modules PM1 to PM2 are connected to the transfer chamber 121 through respective gate valves. The transfer robot Rb2 takes out a wafer W from the load-lock chamber LL1 or LL2 and transfers the wafer W to the process modules PM1 and PM2 in that order. The process module PM1 of the processing system 100 is a plasma processing apparatus capable of executing steps S1b, S1c, S2, S3 and S4S to be described below. Further, the process module PM2 of the processing system 100 is a processing apparatus capable of executing a step S5 to be described below.

Figure 3:
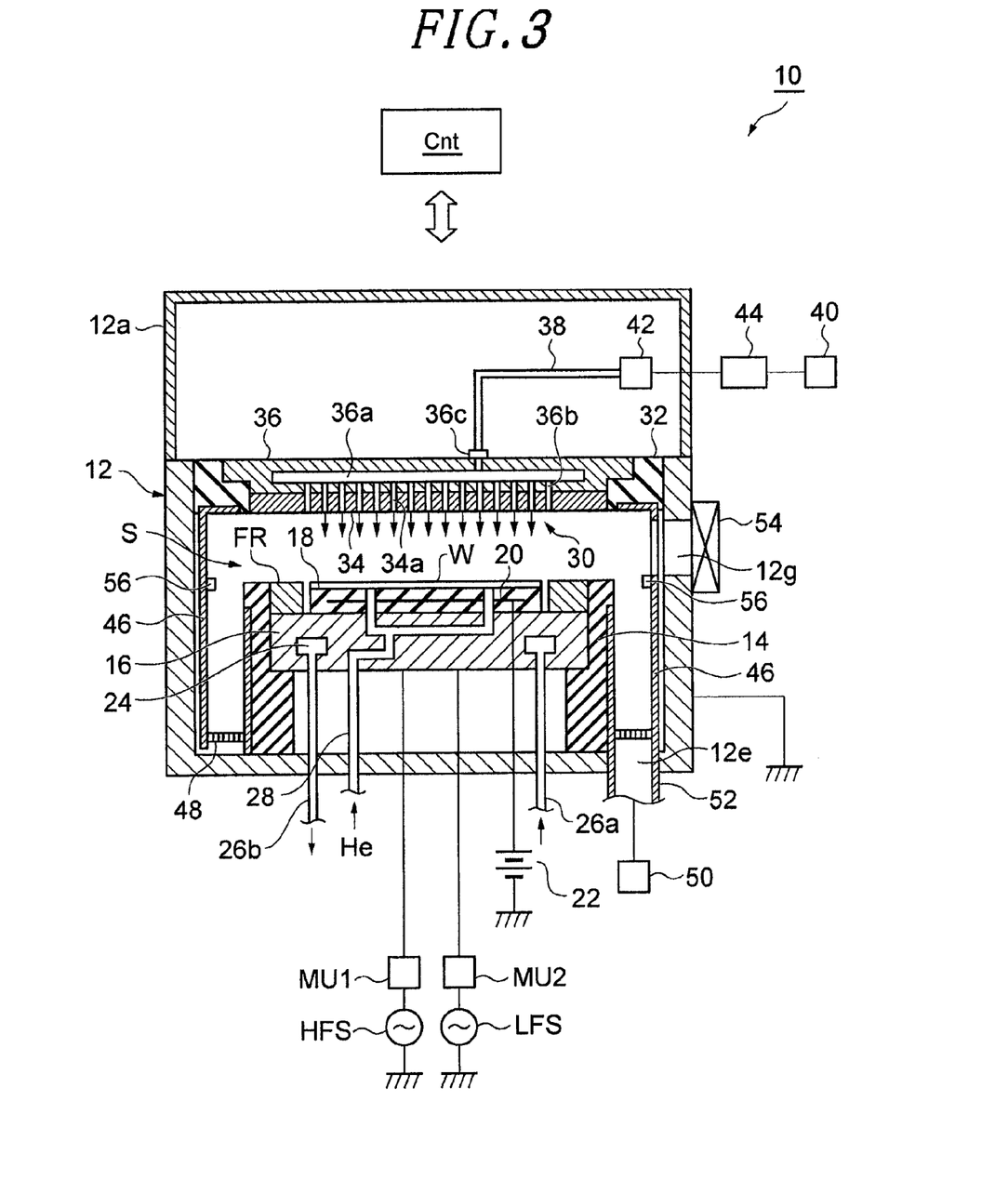
FIG. 3 schematically shows a plasma processing apparatus of the embodiment.

FIG. 3 schematically shows a plasma processing apparatus in accordance with an embodiment of the present invention. FIG. 3 shows a schematic cross sectional view of the plasma processing apparatus 10. The plasma processing apparatus 10 shown in FIG. 3 may be used as the process module PM1 of the processing system 100.

The plasma processing apparatus 10 is a capacitively coupled parallel plate type plasma etching apparatus and includes a substantially cylindrical processing chamber 12. The processing chamber 12 is made of, e.g., aluminum with an anodically oxidized surface. The processing chamber 12 is frame-grounded.

A cylindrical support 14 made of an insulating material is installed on a bottom portion of the processing chamber 12. The support 14 supports a lower electrode 16 by an inner wall surface thereof. The lower electrode 16 is made of metal, e.g., aluminum, and has a substantially disc-shape.

A first high frequency power supply HFS is connected to the lower electrode 16 via a matching unit MU1. The first high frequency power supply HFS generates a high frequency power for plasma generation having a frequency of about 27 MHz to 100 MHz, e.g. about 40 MHz. The matching unit MU1 has a circuit for controlling an output impedance of the first high frequency power supply HFS and an input impedance of a load side (the lower electrode 16 side).

Further, a second high frequency power supply LFS is connected to the lower electrode 16 via a matching unit MU2. The second high frequency power supply LFS generates a high frequency power (high frequency bias power) for ion attraction to the wafer W, and supplies the high frequency bias power to the lower electrode 16. The frequency of the high frequency bias power is within a range from about 400 kHz to 13.56 MHz and, e.g., about 3 MHz. The matching unit MU2 has a circuit for controlling an output impedance of the second high frequency power supply LFS and an input impedance of the load side (the lower electrode 16 side).

An electrostatic chuck 18 is provided on the lower electrode 16. The electrostatic chuck 18 forms a mounting table for supporting the wafer W together with the lower electrode 16. The electrostatic chuck 18 has a structure in which an electrode 20 made of a conductive film is interposed between a pair of insulating layers or insulating sheets. A DC power supply 22 is electrically connected to the electrode 20. The electrostatic chuck 18 can attract and hold the wafer W by an electrostatic force such as a Coulomb force generated by a DC voltage from the DC power supply 22.

A focus ring FR is disposed on the top surface of the lower electrode 16 to surround the electrostatic chuck 18. The focus ring FR is provided to improve etching uniformity. The focus ring FR is made of a material properly selected in accordance with a material of an etching target layer. For example, the focus ring FR is made of silicon or quartz.

A coolant channel 24 is provided inside the lower electrode 16. A coolant of a predetermined temperature, e.g., cooling water, from a chiller unit provided outside is circulated in the coolant channel 24 through lines 26a and 26b. By controlling the temperature of the circulating coolant, the temperature of the wafer W mounted on the electrostatic chuck 18 is controlled.

Further, the plasma processing apparatus 10 includes a gas supply line 28. The gas supply line 28 supplies a heat transfer gas from a heat transfer gas supply unit, e.g., He gas, to a gap between the top surface of the electrostatic chuck 18 and the backside of the wafer W.

Moreover, an upper electrode 30 is provided inside the processing chamber 12. The upper electrode 30 is provided above the lower electrode 16 to face the lower electrode 16 such that the lower electrode 16 and the upper electrode 30 are substantially parallel to each other. A processing space S for performing plasma etching on the wafer W is defined between the upper electrode 30 and the lower electrode 16.

The upper electrode 30 is held at an upper portion of the processing chamber 12 through an insulating shielding member 32. The upper electrode 30 may include an electrode plate 34 and an electrode holder 36. The electrode plate 34 faces the processing space S and has a plurality of gas injection holes 34a. The electrode plate 34 may be made of a semiconductor or a conductor of low resistance having small Joule heat.

The electrode holder 36 detachably holds the electrode plate 34, and may be made of a conductive material, e.g., aluminum. The electrode holder 36 may have a water cooling structure. The electrode holder 36 has therein a gas diffusion space 36a. A plurality of gas holes 36b communicating with the gas injection holes 34a extends downward from the gas diffusion space 36a. Further, the electrode holder 36 has a gas inlet 36c for introducing a processing gas into the gas diffusion space 36a. A gas supply line 38 is connected to the gas inlet 36c.

Figure 4:
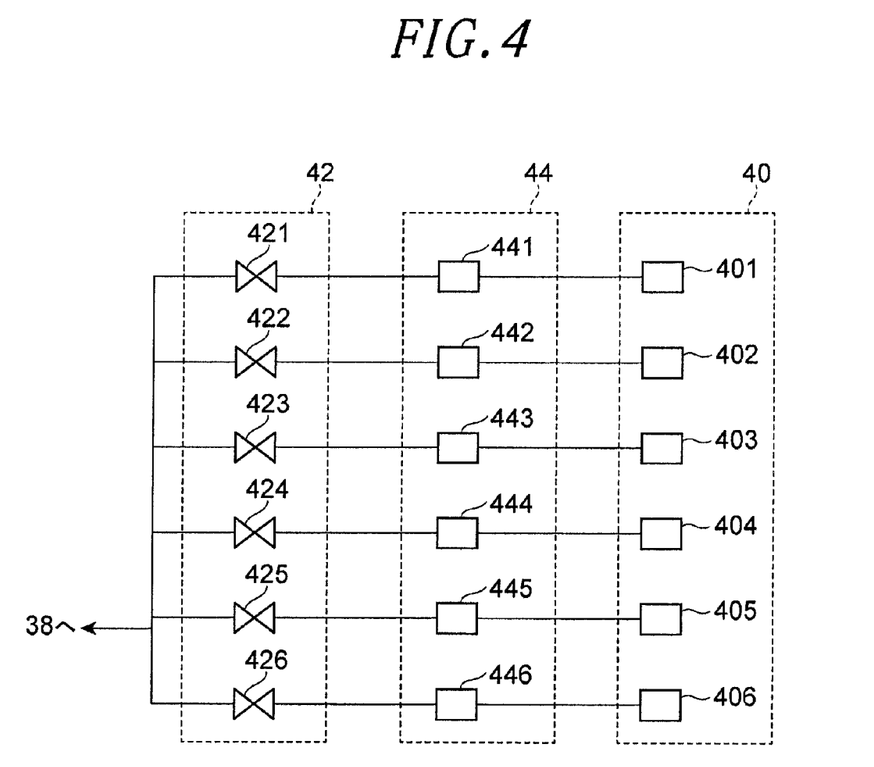
FIG. 4 shows in detail an example of a valve group, a flow rate controller group and a gas source group.

A gas source group 40 is connected to the gas supply line 38 via a valve group 42 and a flow rate controller group 44. FIG. 4 shows in detail an example of the valve group, the flow rate controller group and the gas source group. As shown in FIG. 4, the gas source group 40 includes a plurality of gas sources 410 to 406. The gas sources 401 to 406 are sources of $H_2$ gas, Ar gas, $CH_4$ gas, $O_2$ gas, $CF_4$ gas and $SiCl_4$ gas, respectively. The flow rate controller group 44 includes a plurality of flow rate controllers 441 to 446. The flow rate controllers 441 to 446 are connected to the gas sources 401 to 406, respectively. The flow rate controllers 441 to 446 may be mass flow controllers. The valve group 42 includes a plurality of valves 421 to 426. The valves 421 to 426 are connected to the flow rate controllers 441 to 446, respectively.

In the plasma processing apparatus 10, a gas from at least one gas source selected from the gas sources 401 to 406 is supplied at a controlled flow rate to the gas supply line 38 through the corresponding flow rate controller and the corresponding valve. The gas supplied to the gas supply line 38 reaches the gas diffusion space 36a and is injected to the processing space S through the gas holes 36b and the gas injection holes 34a.

As shown in FIG. 3, the plasma processing apparatus 10 may also include a ground conductor 12a. The ground conductor 12a has a substantially cylindrical shape and extends from the sidewall of the processing chamber 12 to a position higher than the height of the upper electrode 30.

Further, in the plasma processing apparatus 10, a deposition shield 46 is detachably provided along the inner wall of the processing chamber 12. The deposition shield 46 is also provided at the outer periphery of the support 14. The deposition shield 46 prevents adhesion of etching by-products to the processing chamber 12. The deposition shield 46 may be formed by coating ceramic such as $Y_2O_3$ or the like on an aluminum material.

On the bottom portion of the processing chamber 12, a gas exhaust plate 48 is provided between the support 14 and the inner wall of the processing chamber 12. The gas exhaust plate 48 is formed by coating ceramic such as $Y_2O_3$ or the like on an aluminum material, for example. In the processing chamber 12, a gas exhaust port 12e is provided below the gas exhaust plate 48. A gas exhaust unit 50 is connected to the gas exhaust port 12e through a gas exhaust line 52. The gas exhaust unit 50 has a vacuum pump such as a turbomolecular pump or the like, so that the pressure in the processing chamber 12 can be reduced to a desired vacuum level. Further, a loading/unloading port 12g for a wafer W is provided at the sidewall of the processing chamber 12 and can be opened and closed by a gate valve 54.

Moreover, a conductive member (GND block) 56 is provided on the inner wall of the processing chamber 12. The conductive member 56 is adhered to the inner wall of the processing chamber 12 so as to be positioned at the same height level as that of the wafer W. The conductive member is DC-connected to the ground and prevents abnormal discharge.

Further, the plasma processing apparatus 10 may include a control unit Cnt. The control unit Cnt is a computer having a processor, a storage unit, an input device, a display device and the like, and controls each component of the plasma processing apparatus 10. In the control unit Cnt, an operator can input commands to manage the plasma processing apparatus 10 by using the input device and the operation state of the plasma processing apparatus 10 can be displayed on the display device. Further, the storage unit of the control unit Cnt stores therein a control program for controlling various processes performed in the plasma processing apparatus 10 by the processor, or a program, i.e., a processing recipe, for performing the processes of the components of the plasma processing apparatus 10 in accordance with the processing conditions.

In the plasma processing apparatus 10, a gas from at least one gas source selected from the gas sources 401 to 406 is supplied into the processing chamber 12 in order to process the wafer W. Further, a high frequency electric field is generated between the lower electrode 16 and the upper electrode 30 by applying a high frequency power for plasma generation to the lower electrode 16. A plasma of the gas supplied into the processing gas S is generated by the high frequency electric field. The processing such as etching for an etching target layer of the wafer W is performed by the plasma of the gas thus generated. Further, ions are attracted to the wafer W by applying a high frequency bias power to the lower electrode 16. Accordingly, the etching of the etching target layer of the wafer W is facilitated.

Figure 5:
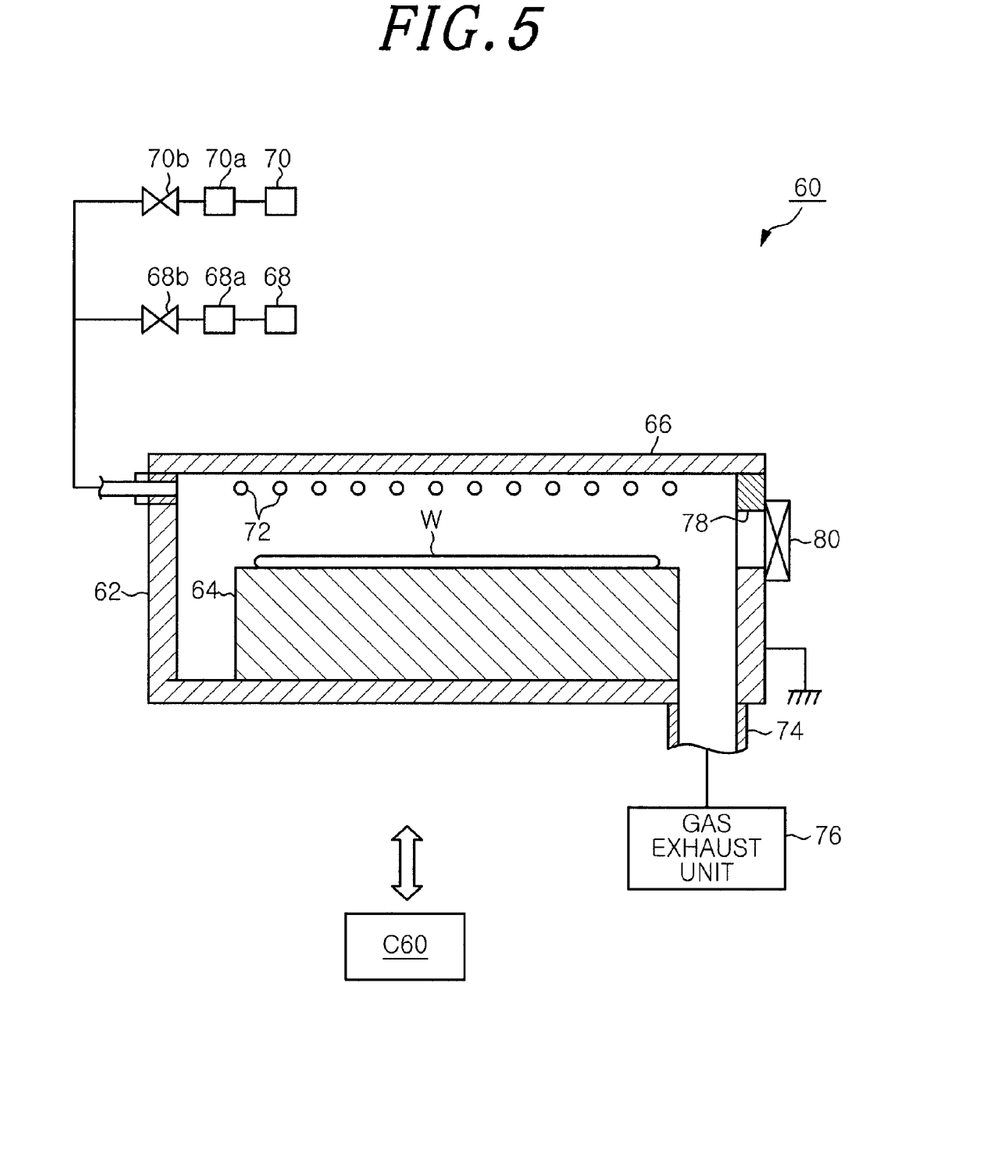
FIG. 5 shows a processing apparatus of an embodiment.

FIG. 5 shows a processing apparatus in accordance with an embodiment. A processing apparatus 60 shown in FIG. 5 may be used as a processing module PM2 of the processing system 100. The processing apparatus 60 includes a tubular (e.g., cylindrical) processing chamber 62 made of metal (e.g., aluminum). The upper opening of the processing chamber 62 is closed by a cover 66. The processing chamber has a space therein. In addition, a wafer loading/unloading port 78 is formed at the sidewall of the processing chamber 62, and a gate valve 80 is provided at the wafer loading/unloading port 78. In this processing apparatus 60, the wafer W is transferred through the wafer loading/unloading port 78.

A mounting table 64 for mounting thereon the wafer W is provided on the bottom portion of the processing chamber 62. The mounting table 64 may be made of aluminum or the like and has a substantially columnar shape (e.g., cylindrical shape). Although not illustrated, the mounting table 64 may be provided with various elements such as an electrostatic chuck for attracting and holding the wafer W by a Coulomb force, a temperature control unit such as a heater, a coolant path or the like, if necessary.

The processing apparatus 60 further includes a source 68 and a gas source 70. The source 68 is a source of hfacH, and communicates with the inner space of the processing chamber 62 via a flow rate controller 68a such as a mass flow controller and a valve 68b. Further, the gas source 70 is a source of $N_2$ gas and communicates with the inner space of the processing chamber 62 via a flow rate controller 70a such as a mass flow controller and a valve 70b. The hfacH and $N_2$ gas supplied from the source 68 and the gas source 70 are supplied into the processing chamber 62 through the gas injection holes 72 provided at the processing chamber 62. Moreover, the processing apparatus 60 may supply, instead of $N_2$ gas or in addition to $N_2$ gas, $O_2$ gas into the processing chamber 62. Further, Ar gas may be supplied as a carrier gas into the processing chamber 62.

A gas exhaust unit 76 for discharging an atmosphere in the processing chamber 62 is connected to the bottom portion of the processing chamber 62. The gas exhaust unit 76 has, e.g., a vacuum pump, and can reduce the pressure in the processing chamber 62 to a predetermined pressure.

A control unit C60 may be connected to the processing apparatus 60. The control unit C60 controls the components of the processing apparatus 60 by sending control signals to, e.g., the temperature control unit of the mounting table 64 of the processing apparatus 60, the flow rate control unit, the valve, the gas exhaust unit and the like.

In this processing apparatus 60, hfacH can be supplied to the wafer W mounted on the mounting table 64 accommodated in the processing chamber 62 to process the wafer W.

Figure 6A:
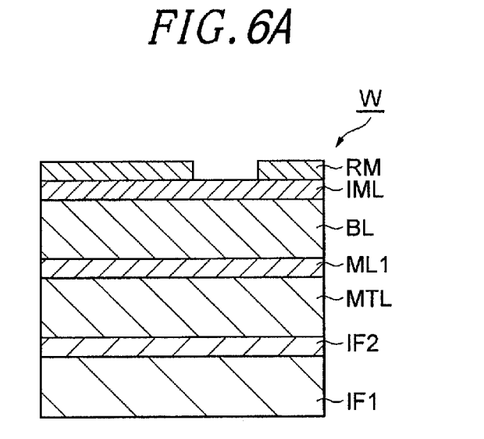
FIGS. 6A to 6E, 7A to 7C and 8A to 8C explain steps of the method M1.
Figure 6B:
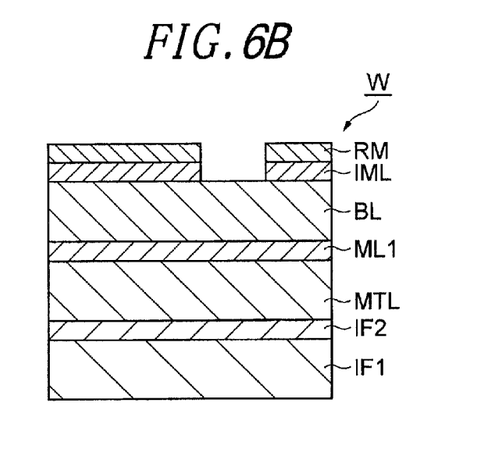
Figure 6C:
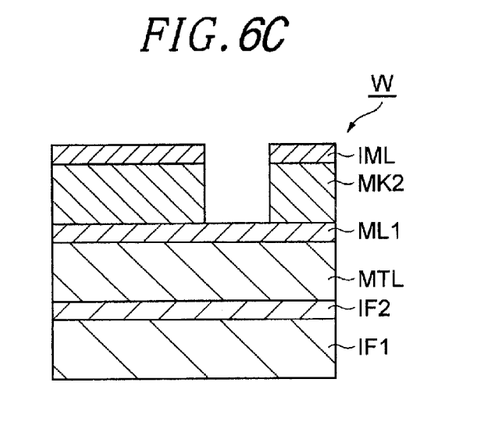
Figure 6D:
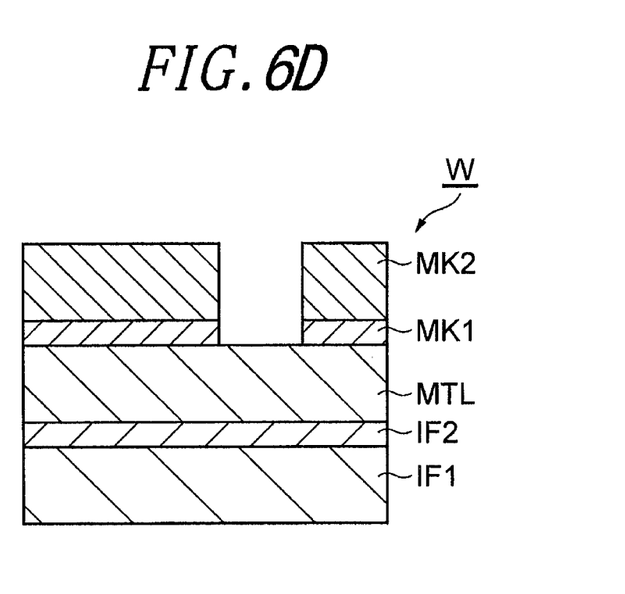
Figure 6E:
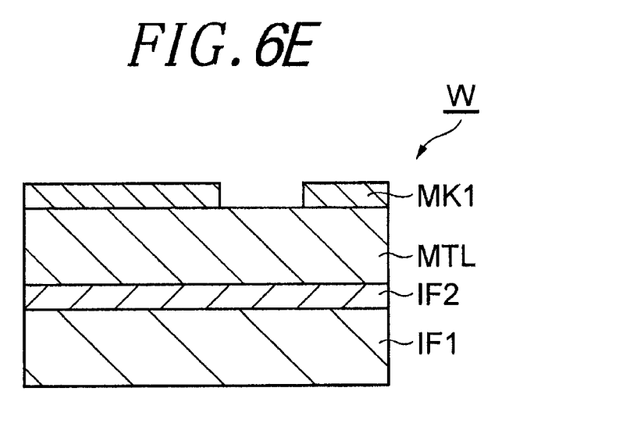
Figure 7A:
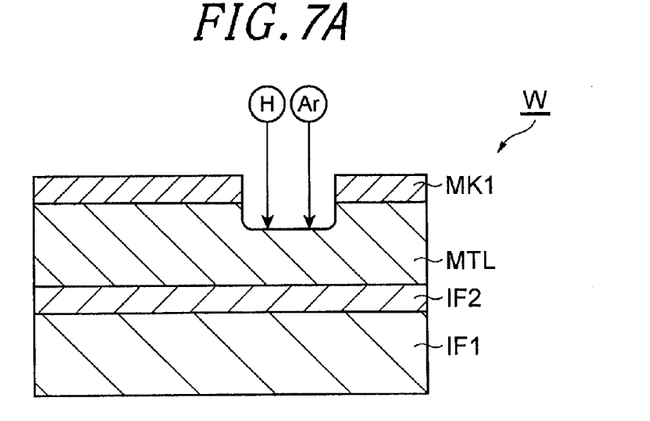
Figure 7B:
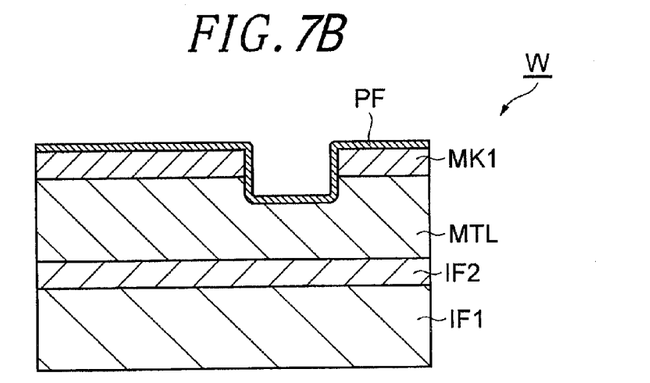
Figure 7C:
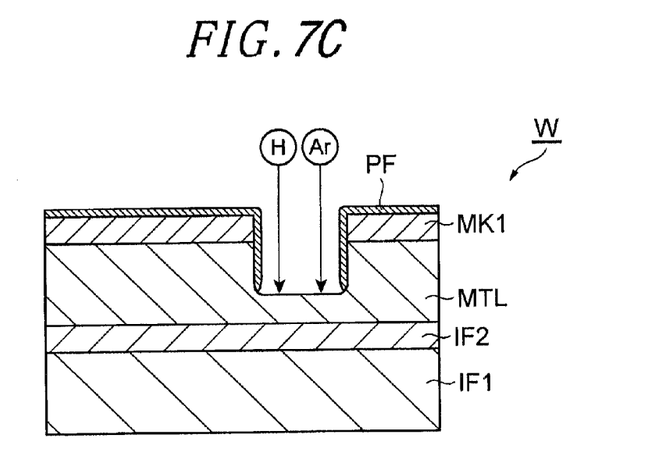
Figure 8A:
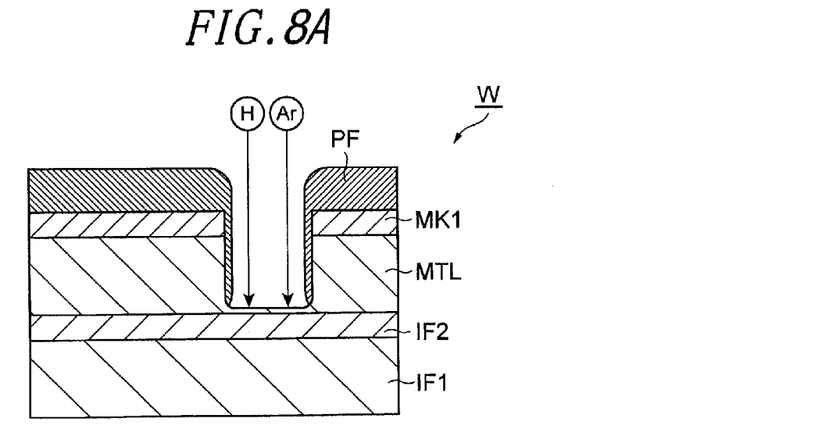
Figure 8B:
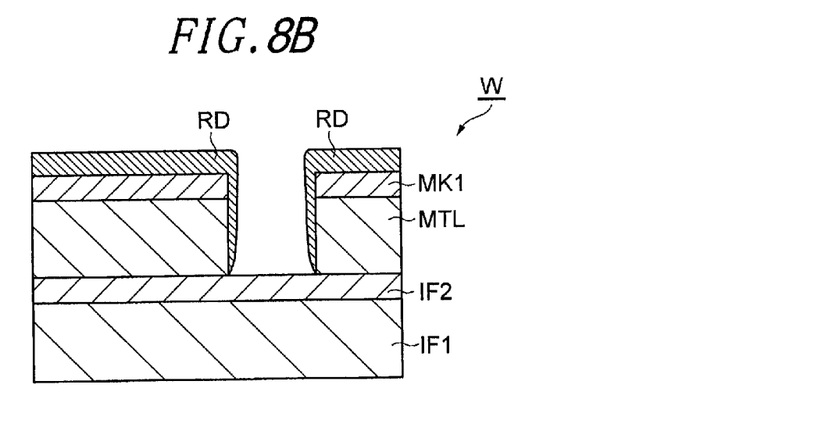
Figure 8C:
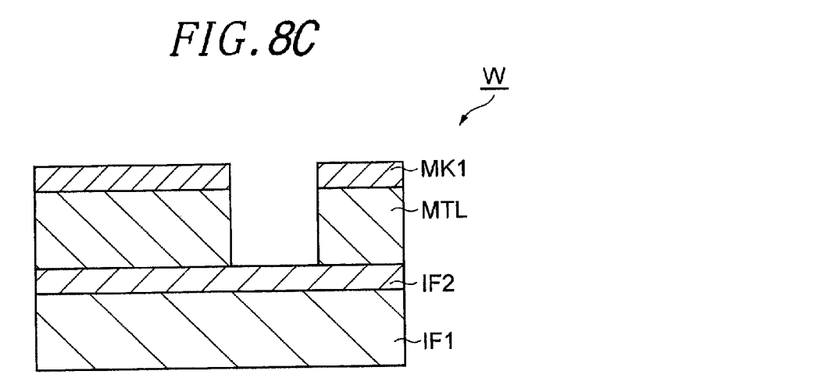

FIG. 1 will be referred to again. Hereinafter, the method M1 that can be implemented by using the processing system 100 will be described in detail with reference to FIGS. 1, 6, 7 and 8. In FIGS. 6 to 8, cross sections of a part of the wafer W during or after the steps of the method M1 are illustrated.

As shown in FIG. 1, in the method M1, a step S1 for forming a mask MK2 is executed. The mask MK2 is used for a process for forming a mask MK1 for etching a copper layer of the wafer W.

The step S1 includes steps S1a, S1b and S1c. In the step S1a, a resist mask is formed. Here, as shown in FIG. 6A, the wafer W has a first insulating film IF1, a second insulating film IF2, a copper layer MTL, a mask layer ML1, a bottom layer BL and an intermediate layer IML. The first insulating film IF1 is an interlayer insulating film and may be made of an insulating material, e.g., SiC, SiON, SiCN. The second insulating film IF2 is formed on the first insulating film IF1 and made of, e.g., SiC. The copper layer MTL is formed on the second insulating film IF2. The mask layer ML1 is formed on the copper layer MTL. The mask layer ML1 is used for etching the copper layer MTL and made of, e.g., silicon nitride or silicon oxide. The bottom layer BL is formed on the mask layer ML1. The bottom layer BL later serves as a mask MK2 for etching the mask layer ML1 and is made of, e.g., an organic film such as amorphous carbon. The intermediate layer IML is formed on the bottom layer BL. The intermediate layer IML may be a SOG (Spin On Glass) film or an anti-reflection film. A resist mask RM formed in the step S1a is formed on the intermediate layer IML. The resist mask RM is formed by a photolithography technique for a resist material such as an ArF resist.

Next, in the method M1, the wafer W shown in FIG. 6A is mounted on the electrostatic chuck 18 of the plasma processing apparatus 10 (the process module PM1), and the step S1b is executed as shown in FIG. 1. In the step S1b, the intermediate layer IML is etched. When the intermediate layer IML is etched, a plasma of a fluorocarbon-based gas, e.g., $CF_4$ gas supplied from the gas source 405 is generated and the wafer W is exposed to the plasma. As shown in FIG. 6B, the pattern of the resist mask RM is transferred to the intermediate layer IML by the step S1b.

Next, in the method M1, the step S1c is executed as shown in FIG. 1. In the step S1c, the bottom layer BL is etched. When the bottom layer BL is etched, a plasma of $O_2$ gas supplied from the gas source 404 is generated and the wafer W shown in FIG. 6B is exposed to the plasma. Further, in the step S1c, $SiCl_4$ gas from the gas source 406 may be supplied into the processing chamber 12. As shown in FIG. 6C, the pattern of the intermediate layer IML is transferred to the bottom layer BL by the step S1c. Accordingly, the mask ML2 formed by the bottom layer BL is obtained. Since the plasma of oxygen gas is used in this step, the resist mask RM disappears.

Next, in the method M1, a step S2 for forming the mask MK1 is executed as shown in FIG. 1. The step S2 includes steps S2a and S2b. in the step S2a, the mask layer ML1 is etched. When the mask layer ML1 is etched, a plasma of a fluorocarbon-based gas, e.g., $CF_4$ gas supplied from the gas source 405 is generated and the wafer W shown in FIG. 6C is exposed to the plasma. Further, in the step S2a, Ar gas from the gas source 402 may be supplied into the processing chamber 12. As shown in FIG. 6D, the pattern of the mask MK2 is transferred to the mask layer ML1 by the step S2a. Accordingly, the mask MK1 formed by the mask layer ML1 is obtained.

Next, in the method M1, the step S2b is executed as shown in FIG. 1. In the step S2b, an ashing process is carried out and the mask MK2 is removed. In the ashing process, a plasma of $O_2$ gas supplied from the gas source 404 is generated and the wafer W shown in FIG. 6D is exposed to the plasma. The wafer W becomes in a state shown in FIG. 6E by the step S2b.

Next, in the method M1, a step S3 is executed as shown in FIG. 1. The step S3 includes steps S3a, S3b, S3c and S3d. In the step S3a, hydrogen gas ($H_2$ gas) supplied from the gas source 401 is supplied while being contained in a first gas into the processing chamber 12. Further, a plasma of the first gas is generated. The first gas may contain Ar gas of the gas source 402. In the step S3a, the copper layer MTL is etched by hydrogen ions, as shown in FIG. 7A. When Ar gas is contained in the first gas, the copper layer MTL is etched by Ar ions. Especially, when the high frequency bias power is applied to the lower electrode 16, the hydrogen ions and the Ar ions are attracted to the copper layer MTL and collide with the surface of the copper layer MTL. The etching of the copper layer MTL is facilitated by this so-called sputter effect. In FIGS. 7A to 7C and 8A to 8C, a notation "H" in a circle indicates the hydrogen ions and a notation "Ar" in a circle indicates the Ar ions.

Next, in the step S3b, a second gas containing hydrogen gas ($H_2$ gas) and a deposition gas, e.g., $CH_4$ gas, respectively supplied from the gas sources 401 and 403 is supplied into the processing chamber 12. Further, a plasma of the second gas is generated. In the step S3b, as shown in FIG. 7B, a protective film PF stem from the $CH_4$ gas, i.e., methane, is deposited on the surface of the wafer W, the film PF contains carbon, e.g., polyethylene. The film PF also contains copper (Cu) generated by etching of the copper film MTL.

Furthermore, in the method M1, the copper layer MTL is etched by the step S3a as shown in FIG. 7C and, then, the step S3b is executed. In the method M1, whether or not the steps S3a and S3b have been repeated for a predetermined number of cycles is determined (step S3c in FIG. 1) as shown in FIG. 1. When the steps S3a and S3b have not been repeated for the predetermined number of cycles, the steps S3a and S3b are executed again. On the other hand, the steps S3a and S3b have been repeated for the predetermined number of cycles, the step S3d is executed. The process of the step S3d is the same as that of the step S3a. The copper layer MTL is etched by the step S3a as shown in FIG. 8A.

In accordance with the steps described above, the mask MK1 is protected during the etching of the step S3 by depositing the film PF on the surface of the mask MK1. Therefore, the erosion of the mask MK1, especially the excessive etching of the angled portion, can be suppressed. As a result, the verticality of the side surface of the etched copper layer is improved. Since the base of the copper layer MTL is protected by the film PF, the damage of the insulating film IF2 by the step S3 is reduced. The second gas contains $H_2$ gas in addition to $CH_4$ gas, so that the excessive deposition of the film PF can be suppressed by relatively controlling the flow rates of the $CH_4$ gas and the $H_2$ gas.

Next, in the method M1, in a step S4, an ashing process for removing the film PF is executed. In the ashing process, a plasma of O2 gas supplied from the gas source 404 is generated and the wafer W is exposed to the plasma. The wafer W becomes in a state shown in FIG. 8B by the step S4. In other words, in the step S4, carbon in the film PF is removed by the ashing process using the oxygen plasma, and a film RD containing copper oxide is formed by bonding between the copper in the film PF and the oxygen. More specifically, the film RF containing $Cu_2O$ and $CuO$ is formed by the following reaction.

After the aforementioned steps are executed by the plasma processing apparatus 10 (the process module PM1), in the method M1, the wafer W is transferred to the processing apparatus 60 (the process module PM2). Further, in the method M, in a step S5, the wafer W is exposed to hfacH. In the step S5, the wafer W is exposed to hfacH under an atmosphere of a pressure of 10 T to 200 T (1333 Pa to 26660 Pa) and a temperature of 150° C. to 300° C. In the step S5, Cu contained in the copper oxide in the film RD is complexed by hfac, and the film RD is removed by removing the generated complex. "hfac" is hexafluoroacetylacetonate ligand obtained when hfacH becomes a monovalent anion by separation of H from hfacH.

Figure 9A:
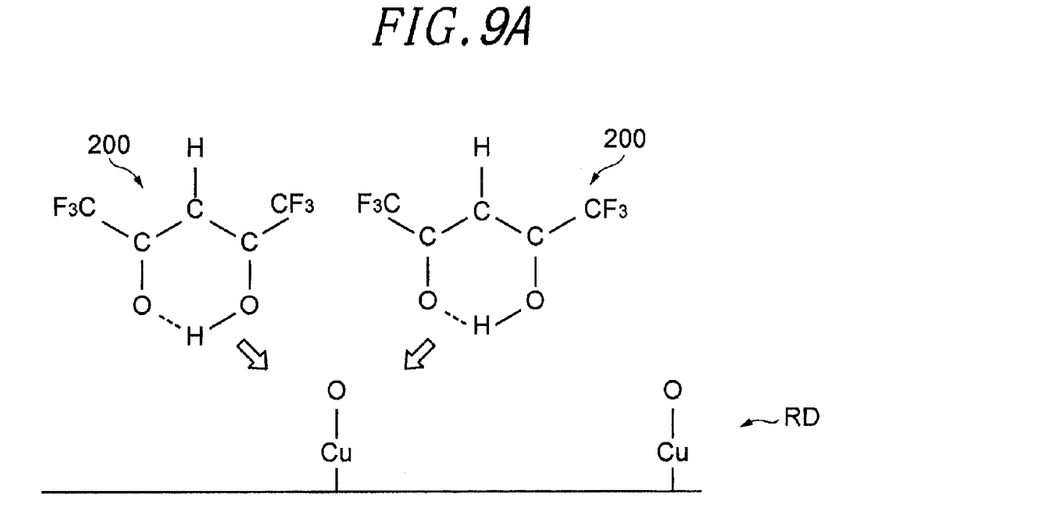
FIGS. 9A and 9B show removal of CuO in a step S5.
Figure 9B:
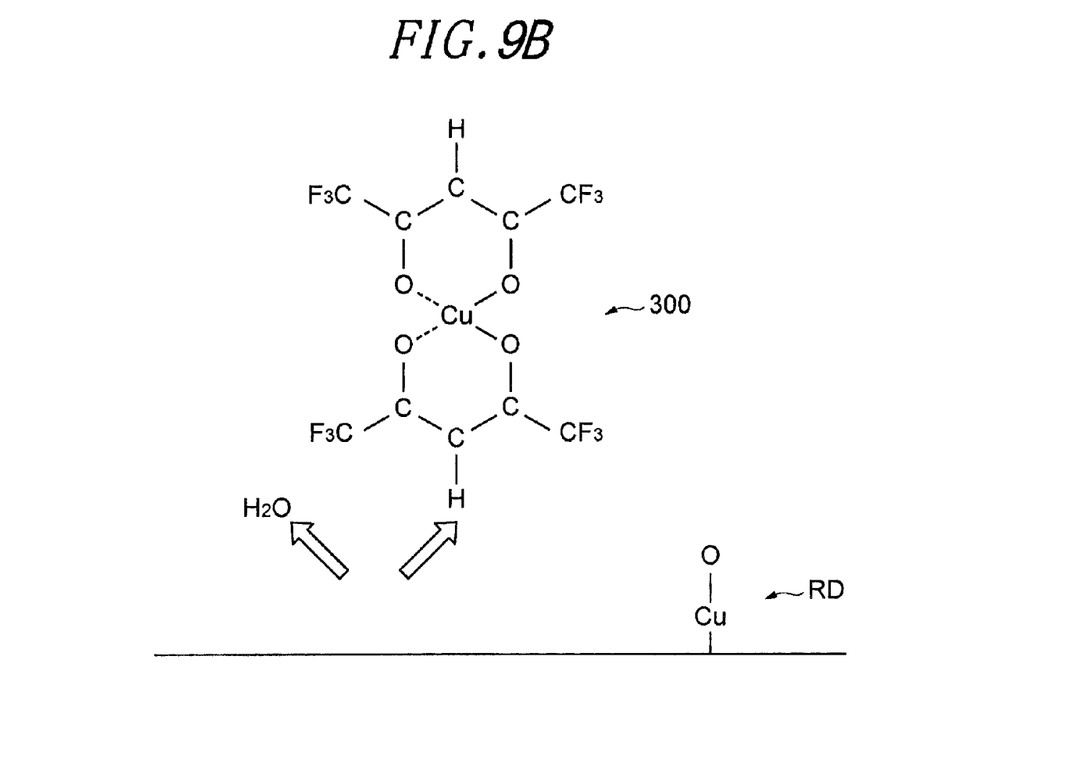
Figure 10A:
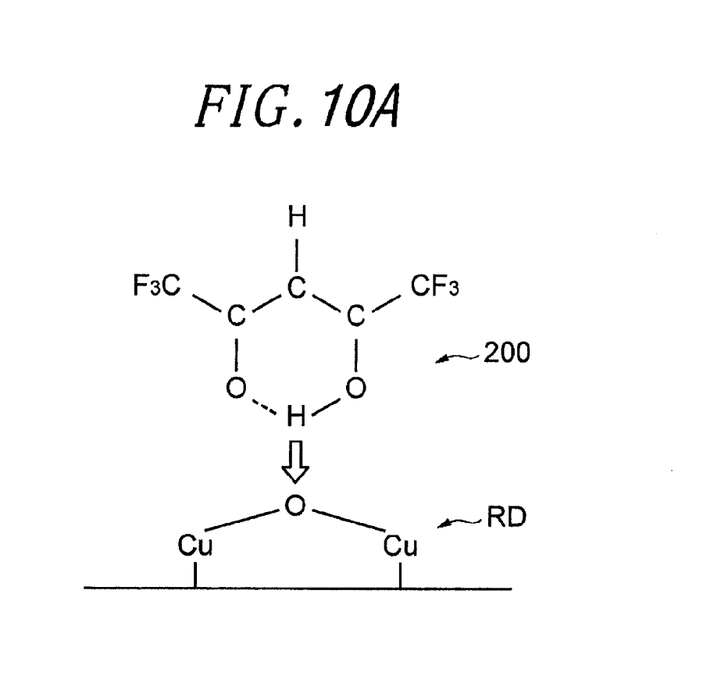
FIG. 10A to 10C show removal of $Cu_2O$ in the step S5.
Figure 10B:
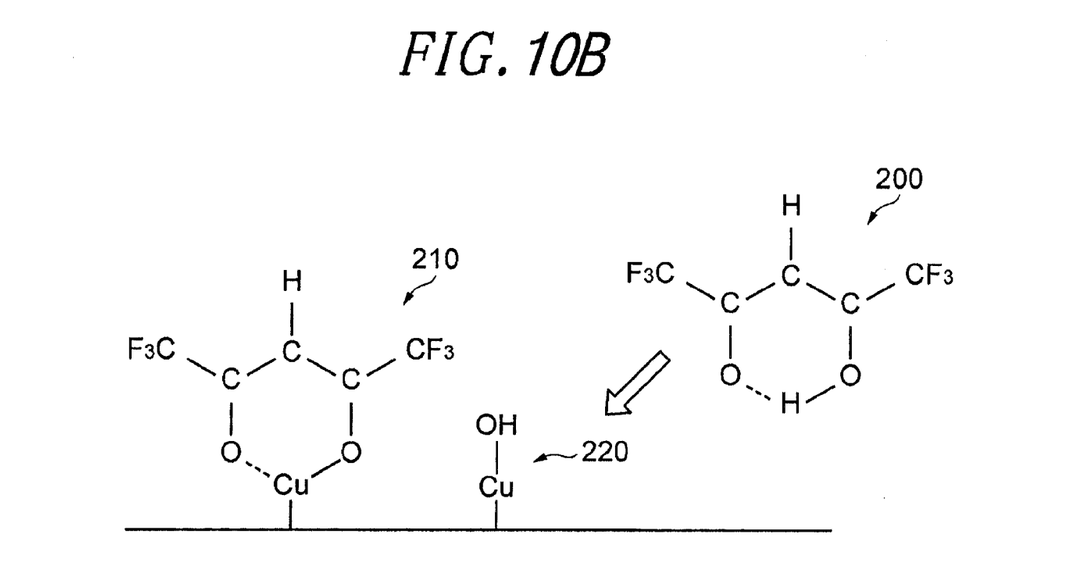
Figure 10C:
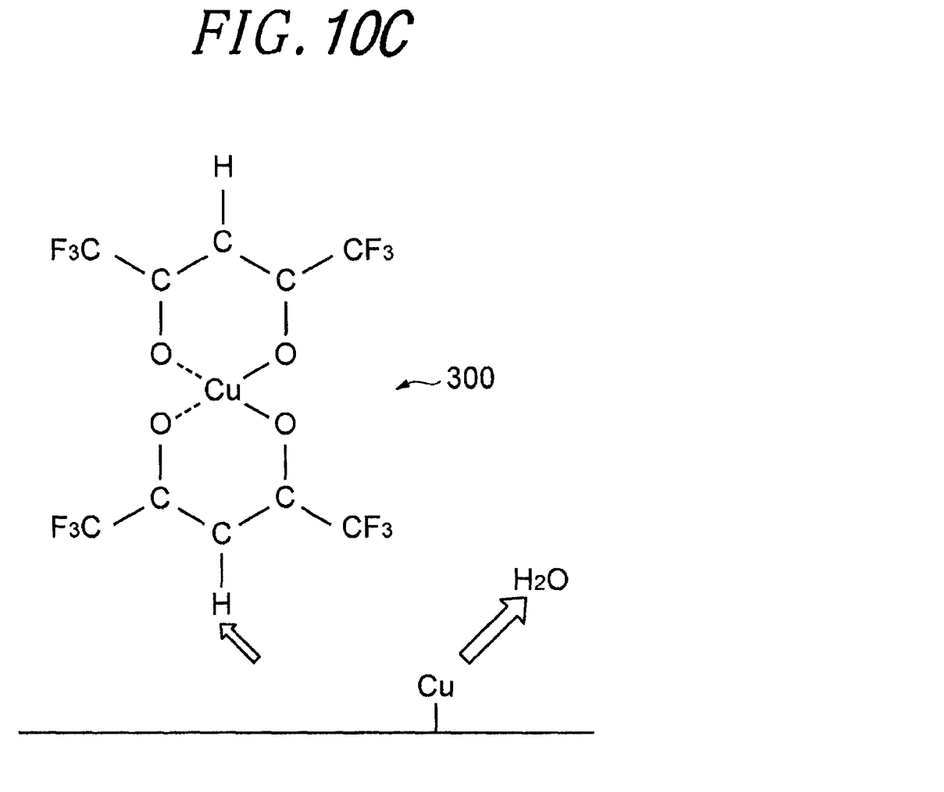

Hereinafter, description will be made with reference to FIGS. 9A to 10C. FIGS. 9A and 9B show removal of CuO in the step S5, and FIGS. 10A to 10C show removal of $Cu_2O$ in the step S5. In the step S5, hfacH (expressed by a reference numeral 200 in the drawings) is supplied to the film RD, as shown in FIGS. 9A and 10A. Further, as shown in FIG. 9B, the complex 300 is generated by two ions generated by separation of H from the bimolecular hfacH, i.e., two hfac, and Cu in CuO forming the film RD. Also, $H_2O$ is generated by bonding between the separated two H atoms and O in CuO. The film RD is removed by exhausting the complex 300 and $H_2O$. The reaction between CuO and hfacH is expressed by the following reaction scheme.

CuO+2(hfacH)→Cu(hfac)$_2$+H$_2$O

As shown in FIG. 10B, the ions generated by separation of H from hfacH, i.e., hfac, are bonded with Cu in $Cu_2O$ forming the film RD (expressed by a reference numeral 210 in the drawing), and OH is bonded with another Cu in $Cu_2O$ (expressed by a reference numeral 220 in the drawing). As shown in FIG. 10B, ions generated by separation of H from additional hfacH, i.e., hfac, reacts with a compound expressed by the reference numeral 210, thereby forming the complex 300 shown in FIG. 10C. Further, $H_2O$ is generated by bonding between OH in the compound expressed by the reference numeral 220 and H separated from hfacH. The film RD is removed by discharging the complex 300 and $H_2O$. The reaction between $Cu_2O$ and hfacH is expressed by the following reaction scheme.

Cu$_2$O+2(hfacH)→Cu+Cu(hfac)$_2$+H$_2$O

In accordance with the method M1 described above, the verticality of the side surface of the etched copper layer can be ensured, and the film RD formed by ashing the protective film PF and carbon in the film PF can be removed.

Hereinafter, a test example that has been executed to examine the aforementioned method M1 will be described.

In the test example, the method M1 was implemented by using the processing system 100. In this test example, the wafer W shown in FIG. 6A was used as the wafer W. In this wafer W, the second insulating film IF2 is an SiC layer having a thickness of 5 nm; the copper layer MTL has a thickness of 35 nm; the mask layer ML1 is an SiN layer having a thickness of 10 nm; the bottom layer BL is an amorphous carbon film having a thickness of 80 nm; the intermediate layer IML is an ARC film having a thickness of 13.5 nm; and the resist mask RM is formed of an ArF resist.

Figure 11:
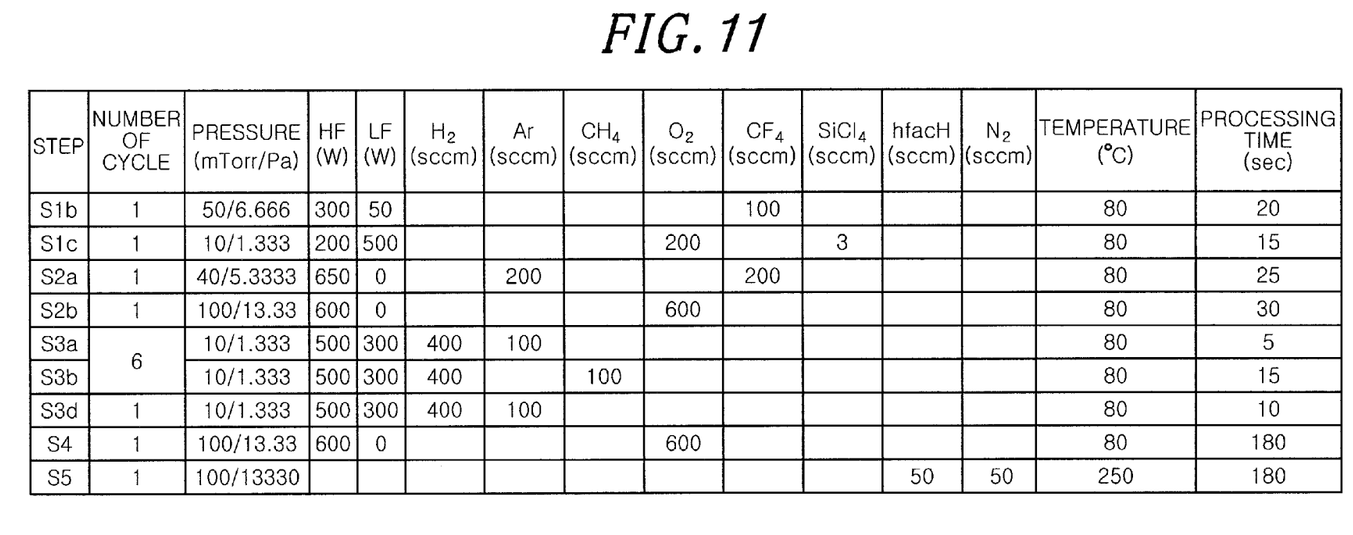
FIG. 11 is a table showing conditions of a test example.

FIG. 11 is a table showing the conditions of the test example. In the test example, the steps of the method M1 were executed under the conditions shown in the table. Meanwhile, in a comparative example, the processes up to the step S4 were executed without performing the steps S5. In the table, "HF" indicates a high frequency power having frequency of 60 MHz generated by the high frequency power supply HFS, and "LF" indicates a high frequency bias power having a frequency of 40 MHz generated by the high frequency power supply LFS.

Figure 12A:
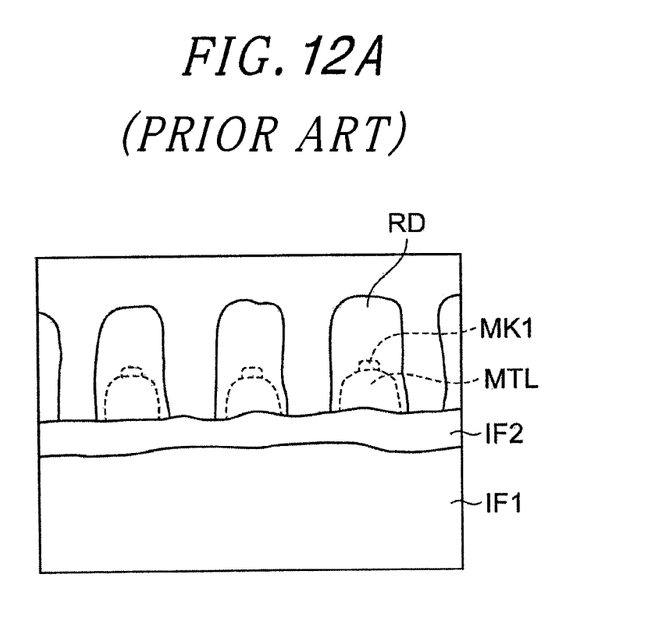
FIGS. 12A and 12B show cross sectional states of processed wafers W in a comparative example and a test example, respectively.
Figure 12B:
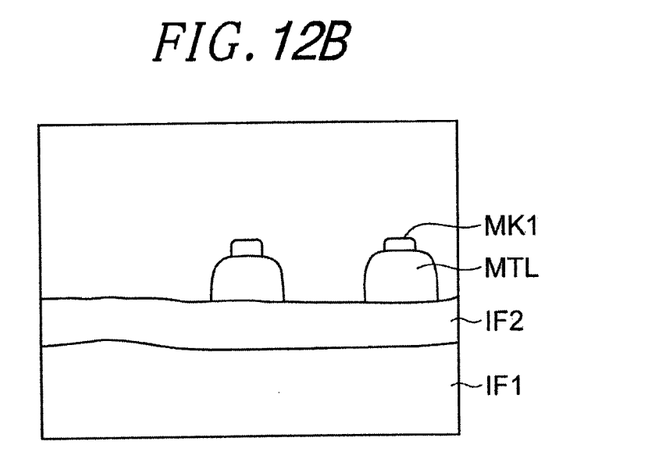

FIGS. 12A and 12B show the cross sections of the processed wafers W in the comparative example and the test example, respectively. FIG. 12A shows a diagram of the processed wafer W in the comparative example, and FIG. 12B shows a diagram of the processed wafer W in the test example. As can be clearly seen from FIG. 12A, the film RD, i.e., copper oxide, remains around the mask MK1 and the copper layer MTL only by performing the step S4, i.e., asking. Meanwhile, as can be clearly seen from FIG. 12B, in the test example, the film RD, i.e., copper oxide, around the mask MK1 and the copper layer MTL is by performing the step S5 after the step S4.

While the invention has been shown and described with respect to the embodiments, it will be understood by those skilled in the art that various changes and modification may be made without departing from the scope of the invention as defined in the following claims.

What is claimed is:

1. A method of etching a metal layer of an object with a patterned mask, comprising:
   a first process of etching the metal layer of the object by ion sputtering etching while forming a first protective film containing carbon and a metal originating from the metal layer on a surface of the patterned mask;
   a second process of performing an ashing process by using an oxygen plasma on the first protective film to remove the carbon contained in the first protective film and form a second protective film containing a metal oxide, the metal oxide being formed by bonding between the metal layer of the first protective film and oxygen from the oxygen plasma; and
   a third process including exposing the object to hexafluoroacetylacetone to remove the second protective film.

2. The method of claim 1, wherein the metal layer is made of copper and the metal oxide includes copper oxide.

3. The method of claim 2, wherein the first protective film includes polyethylene.

* * * * *